United States Patent [19]

Urich

[11] Patent Number: 5,206,645

[45] Date of Patent: Apr. 27, 1993

[54] SINGLE CHANNEL ENCODER

[75] Inventor: George H. Urich, Penfield, N.Y.

[73] Assignee: Xerox Corporation, Stamford, Conn.

[21] Appl. No.: 783,587

[22] Filed: Oct. 28, 1991

[51] Int. Cl.[5] ............................................. H03M 1/22
[52] U.S. Cl. ........................................ 341/11; 341/13
[58] Field of Search ...................... 341/11, 6, 7, 3, 10, 341/11, 13; 250/231.14, 231.3, 231.16, 231.17, 231.18

[56]  References Cited

U.S. PATENT DOCUMENTS

| | | | |
|---|---|---|---|
| 4,025,186 | 5/1977 | Hunt, Jr. et al. | 355/14 |
| 4,233,592 | 11/1980 | Leichlé | 340/347 |
| 4,628,298 | 12/1986 | Hafle et al. | 341/13 |
| 4,786,803 | 11/1988 | Majette et al. | 250/237 |
| 4,789,874 | 12/1988 | Majette et al. | 346/140 |
| 5,013,910 | 5/1991 | Epstein | 250/231.17 |

FOREIGN PATENT DOCUMENTS 5870271  11/1984  Japan ..................................... 341/13

Primary Examiner—A. D. Pellinen
Assistant Examiner—Brian K. Young
Attorney, Agent, or Firm—Gary B. Cohen

[57]  ABSTRACT

An apparatus is provided for generating a pulse train, the apparatus comprising a member having a plurality of spaced marks disposed thereon with at least one of the spaced marks being a reference mark. The member is in communication with means for generating the pulse train as the plurality of spaced marks move. Additionally, the pulse train has a periodicity defined by the same edge of two successive pulses and the plurality of spaced marks are configured so that the periodicity of the pulse train remains constant.

12 Claims, 8 Drawing Sheets

SINGLE CHANNEL ENCODER

BACKGROUND OF THE INVENTION

1. Field of the Invention

The present invention relates generally relates to an apparatus and method for determining the position of a moving component and more particularly to a single channel encoder.

2. Description of the Prior Art

Generally, the process of electrophotographic printing includes charging a photoconductive member to a substantially uniform potential so as to sensitize the surface thereof. The charged surface of the photoconductive surface may be exposed to a light image of an original document to record an electrostatic latent image on the photoconductive member, the latent image corresponding to the informational areas contained in the original document. After the electrostatic latent image is recorded on the photoconductive member, the latent image is developed by bringing a toner material, such as a suitable powder or liquid, into contact with the photoconductive member. A toner image is formed on the photoconductive member, which toner image is subsequently the photoconductive member, which toner image is subsequently transferred to a support member. Finally, the toner image is heated for fusing it permanently to the support member in image configuration.

In a typical electrophotographic printing machine a plurality of processing stations are positioned about the photoconductive member. Furthermore, other processing stations are located in the path of the copy sheet. These processing stations perform all of the operations necessary to insure that a completed copy of an original document is generated. Each processing station is energized at a selected time during the operating cycle. This is achieved by a timing pulse generator associated with the photoconductive member.

In one example, the timing pulse generator comprises a disk coupled with the photoconductive member, the disk having a plurality of spaced apart marks thereon. The marks are arranged on the disk so that the marks can rotate with the photoconductive drum when the disk is rotatably mounted therewith. Each mark serves as a position indicator for timing the operations in the printing machine. The timing pulse generator further comprises a light source and a photodetector, both of which can be respectively disposed on opposing sides of the disk to sense the passage of the marks. In this way, a pulse is generated for each increment between adjacent marks of the disk. These pulses are transmitted to a control system for actuating one of the processing stations at an appropriate time to permit the formation of a copy of the original document on the support member.

When using the disk in a rotary encoder arrangement, it is desirable to generate an index pulse upon each revolution of the disk for indicating a point of origin of the disk. With this origin, the angular position of the disk, and thus the angular position of a moving component, such as the photoconductive member, can be determined readily. The following patent discloses a rotary encoder in which such an index pulse is generated:

U.S. Pat. No. 4,233,592; Patentee: Leichie; issued Nov. 11, 1980

U.S. Pat.No. 4,233,592 discloses an angular position detecting apparatus which provides an absolute position reference by detecting a "missing tooth" in a notched disk. In operation, a positioned sensor detects the passage of teeth on the rotating notched disk and generates a corresponding output signal in the form of a pulse train. The missing tooth in the disk creates a gap or delay int he pulse train output as it passes by the positioned sensor. That gap or delay can be detected by a circuit comprising a Schmidt trigger and monostable multivibrator detecting circuit for determining an absolute reference position of the disk.

The following patents relate to linear, single channel encoders which are capable of generating information regarding the position of a moving sensor head relative to a strip having counting and reference pulses disposed thereon:

U.S. Pat. No. 4,786,803; Patentee: Majette et al.; Issued Nov. 22, 1988

U.S. Pat. No. 4,789,874; Patentee: Majette et al.; Issued Dec. 6, 1988

U.S. Pat. No. 4,786,803 discloses a single channel encoder system that controls the movement of an ink jet print head by detecting a reference position marking on an encoder strip. A detector reads several wide bands located on a strip of regularly-spaced narrow scale lines to generate a pulsed signal output indicative of a reference position for the print head.

U.S. Pat. No. 4,789,874 discloses a single channel encoder system that controls the carriage position and movement of an ink jet pen relative to the detection of an irregular delay in a pulsed signal output. In operation, a detector reads a pattern of closely-spaced narrow print bands on an encoder strip and converts the pattern into a logic output signal. A wide band on the encoder strip generates a corresponding irregular delay in the output signal, which delay can be detected to provide a position reference for controlling the movement of the ink jet pen.

A dual encoder arrangement adapted for use with a photoconductive member is disclosed in the following patent:

U.S. Pat. No. 4,025,186; Patentee: Hunt, Jr. et al; Issued: May 24,1977

While the wide bands of the Majette et al. patents serve to indicate the position of the print head or pen relative to the encoder strip, the wide bands cannot be counted as timing pulses. That is, during the period in which the detector is being passed over one of the wide bands, the count of the timing pulses must be halted. Thus, the wide bands cannot be used to generate both timing pulses and reference pulses. Similarly, the missing tooth of the Leichle patent is not intended for use as a timing pulse. Indeed, Leichle discloses a circuit specifically devised to reconstitute the timing pulse lost as a result of using the missing tooth. It would be desirable to provide a single channel encoder possessing a reference pulse that can be employed as both a timing pulse and a position indicating pulse.

SUMMARY OF THE INVENTION

In accordance with the present invention an improved apparatus is provided for generating a pulse train. The apparatus comprises a member having a plurality of spaced marks disposed thereon with at least one of the spaced marks being a reference mark. The member is in communication with means for generating the pulse train as the plurality of spaced marks move. Additionally, the pulse train has a periodicity defined by the same edge of two successive pulses and the plurality of spaced marks are configured so that the periodicity of the pulse train remains constant.

In one aspect of the present invention, the member comprises a disk, the disk having a track that is concentric about the center of the disk. The spaced marks are disposed along the track and each of the spaced marks are substantially transverse to the track. In another aspect of the present invention, the member comprises an elongate strip, the strip having a central axis. The spaced marks are disposed along the central axis and each of the spaced marks is substantially transverse to the central axis. In yet another aspect of the present invention, the generating means comprises means for transmitting a beam and means for receiving the beam. In one example, the member is disposed intermediate of the transmitting means and the receiving means.

In another preferred embodiment of the present invention, a pulse generating apparatus adapted for use in a printing apparatus of the type having a moving photoconductive member is provided. The pulse generating apparatus comprises a disk having a plurality of spaced marks disposed thereon with at least one of the spaced marks being a reference mark. Moreover, the plurality of spaced marks are substantially colinear. Preferably, the disk is coupled with the photoconductive member so that the disk moves in unison with the photoconductive member. The disk is in communication with means for generating the pulse train as the plurality of spaced marks move and a reference pulse mark is generated each time the reference mark is detected by the generating means.

In yet another preferred embodiment of the present invention, a pulse generating apparatus comprises a photoconductive member having a plurality of spaced marks disposed thereon with at least one of the spaced marks being a reference mark. Moreover, the plurality of spaced marks are substantially colinear. Preferably, the photoconductive member is in communication with means for generating the pulse train as the plurality of spaced marks move and a reference pulse is generated each time the reference mark is detected by the generating means.

Numerous features of the present invention will be appreciated by those skilled in the art. One feature of the present invention is that the member having a plurality of marks is configured with a mark that can be used to generate both a timing pulse and an index pulse.

Another feature of the present invention is that the pulse train can be generated with a minimum amount of components. Thus cost savings are realized and greater reliability is achieved.

Yet another feature of the invention is that the generated pulses can be processed with an exceedingly simple methodology.

Yet another feature of the present invention is that the encoder can be implemented with a disk operatively coupled to a moving component, such as a photoconductive member, so that the angular position of the moving component can be monitored continuously.

Another feature of the present invention is that the disk can be housed conveniently in a modular unit, the unit being adapted for coupling with a shaft so that the disk can be moved in unison with the shaft.

These and other aspects of the invention will become apparent from the following description, the description being used to illustrate a preferred embodiment of the invention when read in conjunction with the accompanying drawings.

DESCRIPTION OF A PREFERRED EMBODIMENT OF THE INVENTION

While the present invention will hereinafter be described in connection with a preferred embodiment thereof, it will be understood that it is not intended to limit the invention to that embodiment. On the contrary, it is intended to cover all alternatives, modifications and equivalents as may be included within the spirit and scope of the invention as defined by the appended claims.

Figure 1:
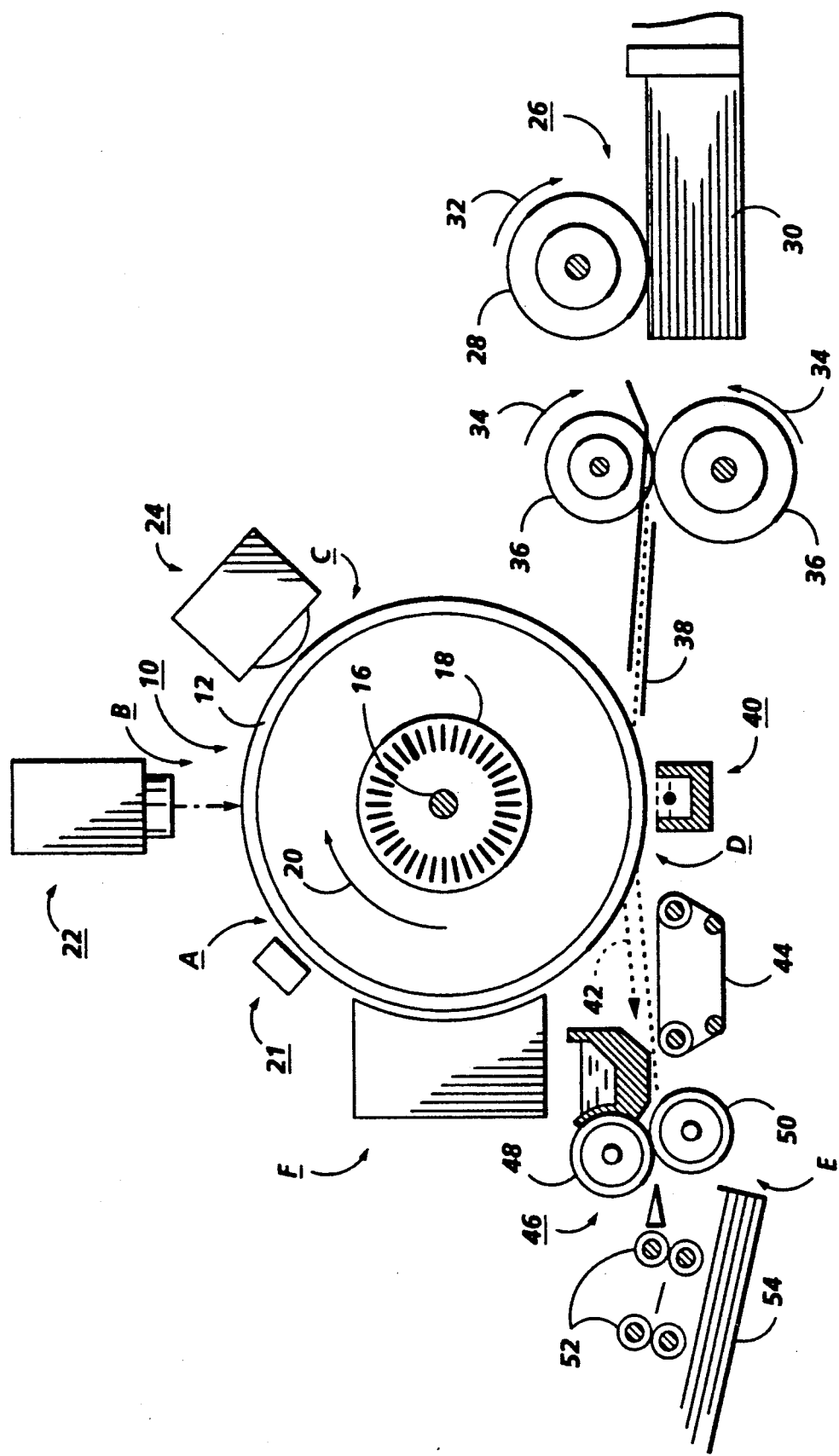
FIG. 1 is a schematic, elevational view of an electrophotographic printing machine incorporating various features of the present invention.

Inasmuch as the art of electrophotographic printing is well known, the various processing stations employed in the electrophotographic printing machine of FIG. 1 will be shown hereinafter schematically and their operation described briefly with reference thereto. As shown in FIG. 1, the illustrative electrophotographic printing machine employs a drum 10 having a photoconductive surface 12. By way of example, photoconductive surface 12 is made from a selenium alloy adhering to an electrically grounded conductive substrate, made from aluminum. Drum 10 is mounted on a rotatable shaft 16 which extends outwardly therefrom. In one disclosed embodiment of the present invention, a disk 18 is mounted on the shaft 16 and is therefore rotatable about the axis of shaft 16. The drum 10 moves in the direction of arrow 20 to advance photoconductive surface 12 sequentially through a variety of processing stations disposed about the path of movement thereof.

Initially, a portion of photoconductive surface 12 passes through charging station A. At charging station A, a corona generating device, indicated generally by the reference numeral 21 charges photoconductive surface 12 to a relatively high, substantially uniform potential.

Next, the charged portion of photoconductive surface 12 is advanced through exposure station B. Exposure station B includes an exposure system indicated generally by the reference numeral 22. Exposure system 22 includes a light source which illuminates an original document positioned face down upon a transparent platen (not shown). Light rays reflected from the original document are transmitted through a lens (not shown) to form a light image thereof. The light image is focused onto the charged portion of photoconductive surface 12 to selectively dissipate the charge thereon. This records an electrostatic latent image on photoconductive surface 12 which corresponds to the informational areas contained within the original document. One skilled in the art will appreciate that in lieu of the foregoing optical system, a modulated beam of energy, i.e. a laser beam, or other suitable device, such as light emitting diodes may be used to irradiate the charged portion of the photoconductive surface so as to record selected information thereon. Information from a computer may be employed to modulate the laser beam or selectively energize the light emitting diodes.

After the electrostatic latent image is recorded on photoconductive surface 12, drum 10 advances the latent image to development station C. At development station C, a magnetic brush development system, indicated generally by the reference numeral 24, advances a developer material comprising carrier granules and toner particles into contact with the electrostatic latent image. The latent image attracts the toner particles from the carrier granules of the developer material to form a toner powder image on photoconductive surface 12 of drum 10.

Drum 10 then advances the toner powder image adhering to photoconductive surface 12 to transfer station D. At transfer station D, a support member, such as a sheet of support material, is moved into contact with the powder image. The sheet of support material is advanced to transfer station D by a sheet feeding apparatus, indicated generally by the reference numeral 26. Preferably, sheet feeding apparatus 26 includes a feed roll 28 contacting the uppermost sheet of a stack of sheets 30. Feed roll 28 rotates in the direction of arrow 32 to advance the uppermost sheet 30 into a nip defined by forwarding rollers 36. Forwarding rollers 36 rotate in the direction of arrows 34 to advance the sheet 30 into chute 38. Chute 38 directs the advancing sheet 30 of support material into contact with photoconductive surface 12 of drum 10 in a timed sequence so that the toner powder image developed thereon contacts the advancing sheet 30 at transfer station D. Preferably, transfer station D includes a corona generating device 40 for spraying ions onto the backside of the sheet 30. This attracts the toner powder image from photoconductive surface 12 to the sheet 30. After transfer, the sheet 30 continues to move in the direction of arrow 42 onto conveyor 44 which advances the sheet to fusing station E.

Fusing station E includes a fuser assembly, indicated generally by the reference numeral 46, which permanently fuses the transferred toner powder image to the sheet 30. Fuser assembly 46 includes a heated fuser roller 48 and a back-up roller 50. The sheet 30 passes between fuser roller 48 and back-up roller 50 with the toner powder image contacting fuser roller 48. In this manner, the toner powder image is permanently fused to the sheet 30. After fusing, forwarding rollers 52 advance the sheet 30 to catch tray 54 for removal from the printing machine by the operator.

Invariably, after the sheet of support material is separated from photoconductive surface 12 of drum 10, some residual particles remain adhered thereto. These residual particles are removed from photoconductive surface 12 at cleaning station F. Preferably, cleaning station F includes a rotatably mounted brush (not shown) in contact with photoconductive surface 12. The particles are cleaned from photoconductive surface 12 by the rotation of the brush in contact therewith. Subsequent to cleaning, a discharge lamp (not shown) floods photoconductive surface 12 with light to dissipate any residual electrostatic charge remaining thereon prior to the charging thereof for the next successive imaging cycle.

Figure 2A:
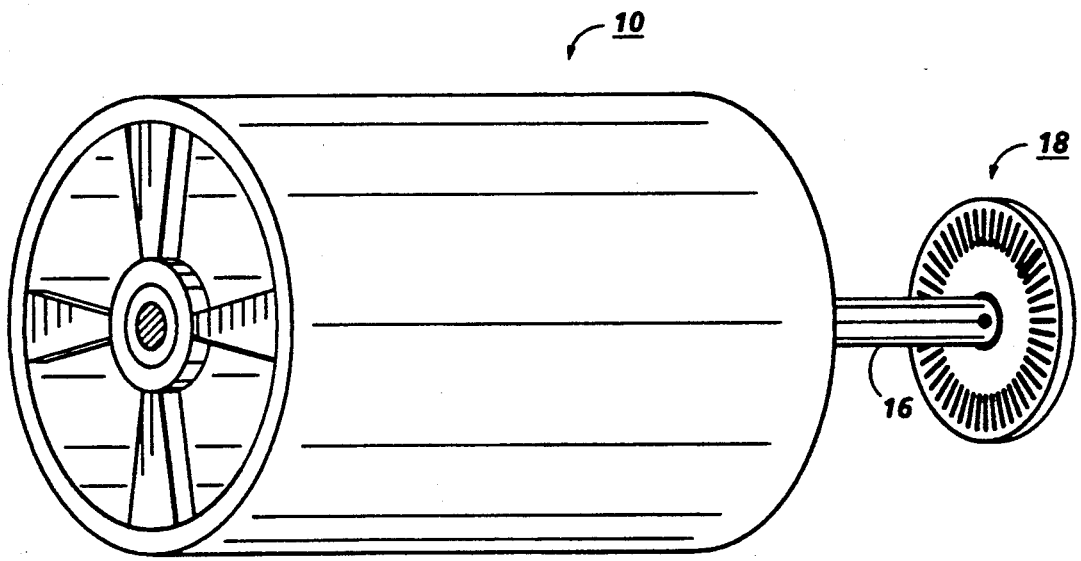
FIG. 2A is a schematic, perspective view of a photoconductive member coupled with a disk having spaced marks disposed thereon, the disk being adapted for use in a single channel encoder of the present invention.
Figure 2B:
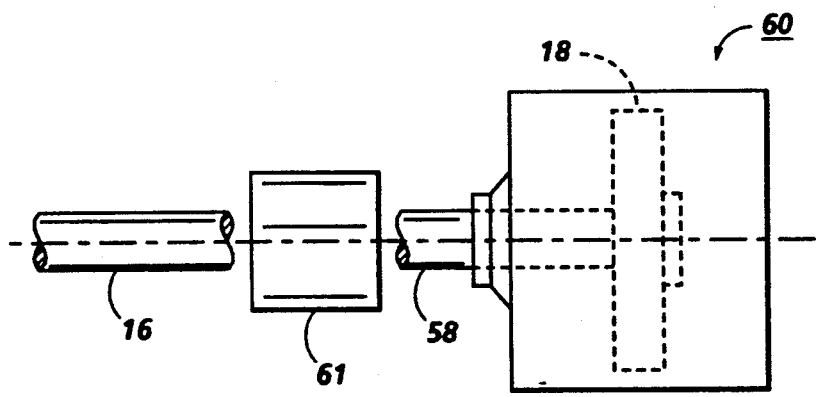
FIG. 2B is an elevational, exploded view of a modular unit housing the disk, the modular unit being coupled with a shaft.
Figure 7:
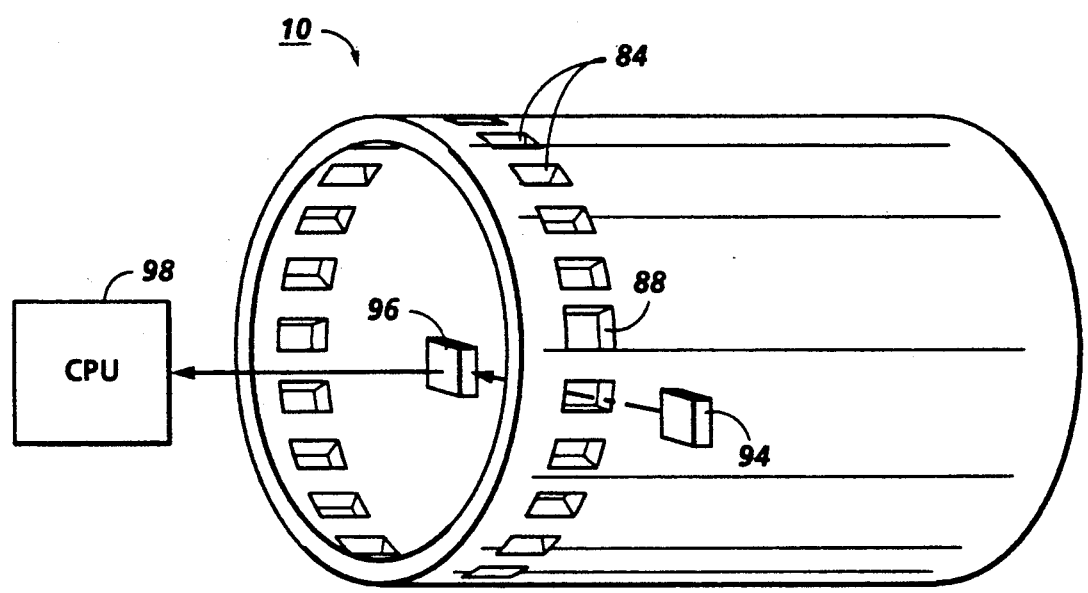
FIG. 7 is a schematic, elevational view of the photoconductive member adapted for use in the single channel encoder of the present invention.

Referring now to FIG. 2A, the disk 18 is shown secured fixedly to shaft 16 so that disk 18 rotates in unison with the shaft 16. While in the illustrated embodiment of FIG. 2A the disk 18 is shown mounted directly to the shaft 16, the disk could be mounted to a shaft 58 (FIG. 2B), the shaft 58 being rotatably mounted in an encoder housing 60. When the disk 18 is mounted in the encoder housing 60, the shafts 16 and 58 are coupled with conventional coupling means 61 so that the shafts 16 and 58 rotate in unison. Additionally, referring to FIG. 7, a preferred embodiment is contemplated in which the function of the disk 18 is achieved by suitable adaptation of the drum 10. An approach in which a dual encoding arrangement is applied to a photoconductive member can be found in U.S. Pat. No. 4,025,186. Finally, it will be appreciated by those skilled in the art that the concept underlying the present invention would not be altered by coupling the disk 18 to other moving components associated with the drum 10.

Figure 3:
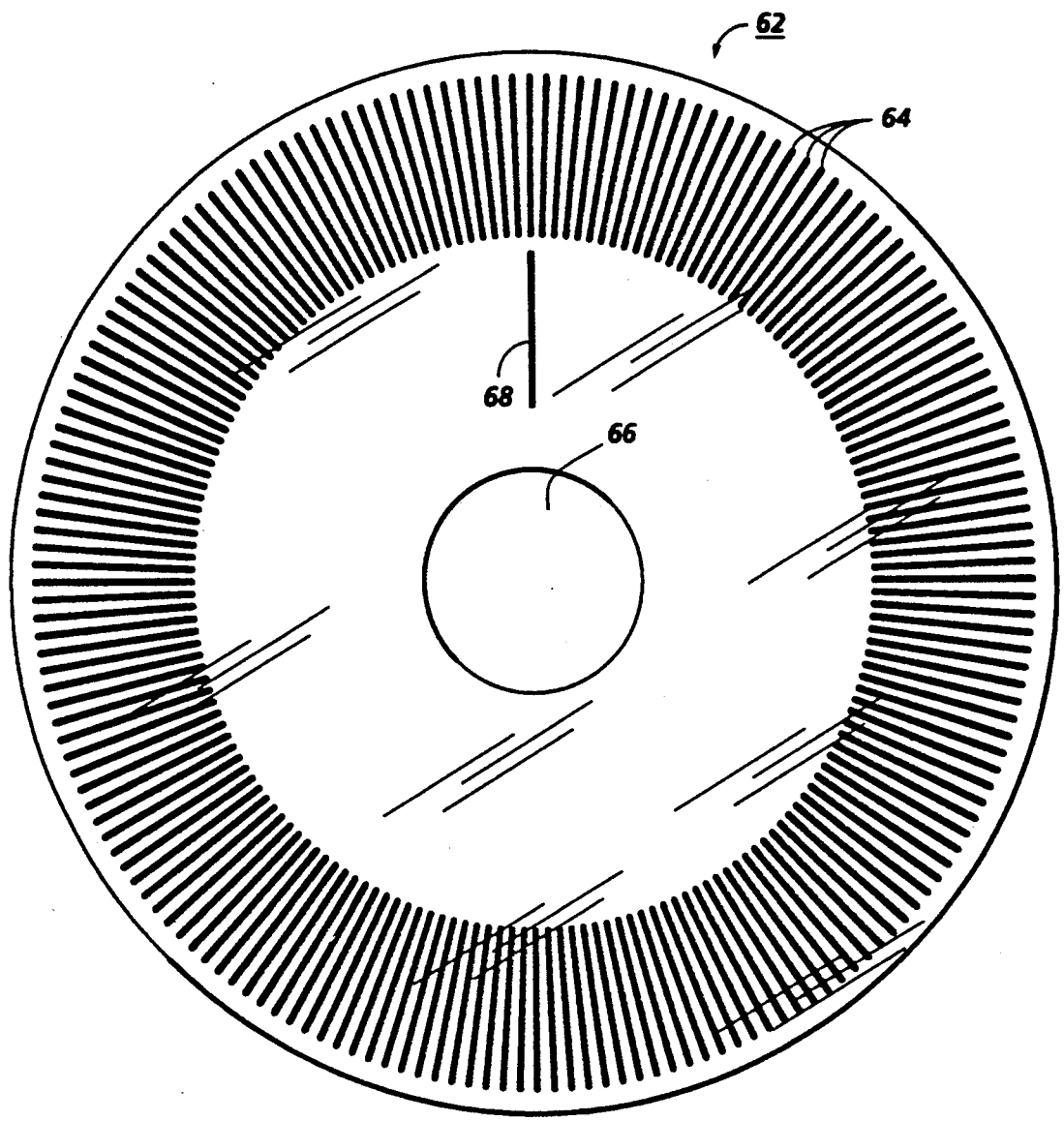
FIG. 3 is an elevational view of a known disk with marks disposed thereon, the disk being adapted for use in a known dual channel encoder.

Referring to FIG. 3, a known disk, which has been used in place of the disk 18, is designated by the numeral 62. The known disk 62 comprises a set of marks 64, the marks 64 being arranged along a common track concentrically about a center 66 of the disk 62. A reference mark 68 is disposed intermediate of the marks 64 and the disk center 66. The disk 62 is particularly adapted for use in an encoder of the type commonly referred to as a "dual channel encoder." Additionally, the disk 62 can be constructed of a durable, translucent material, such as a conventional plastic or the like.

Figure 4:
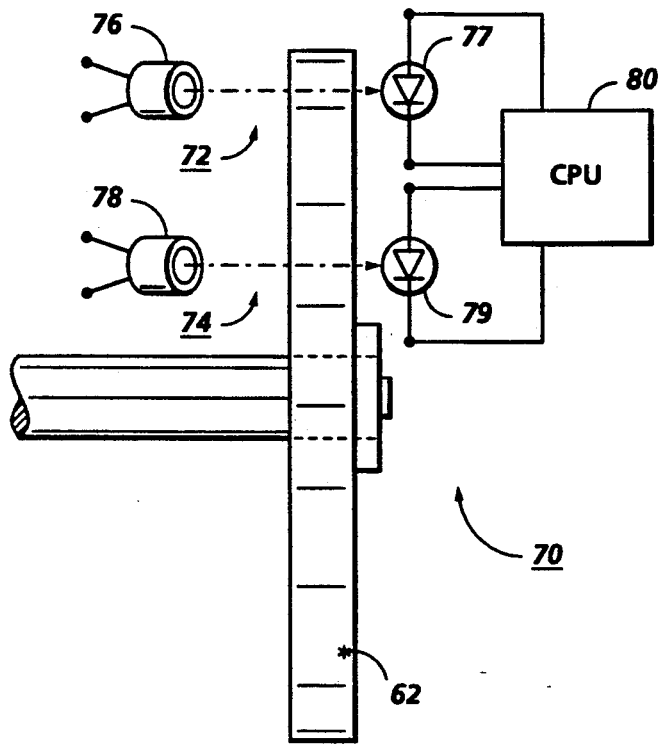
FIG. 4 is a schematic, elevational view of the dual channel encoder.

Referring to FIG. 4, a known dual encoding arrangement, designated by the numeral 70, is shown. The encoding arrangement 70 comprises pulse generating systems 72, 74, both of which are structurally equivalent. Preferably, the pulse generating system 72 comprises a phototransmitter 76 aligned with a photoreceptor 77, while the pulse generating system 74 comprises a phototransmitter 78 aligned with a photoreceptor 79. Both of the photoreceptors 77, 79 are coupled with a conventional CPU 80, such as a 16-bit microprocessor manufactured by Motorola under the 68000 series. To implement the encoding arrangement 70, the sensing systems 72, 74 are positioned relative to disk 62 so that, as the disk 62 is rotated, the beam of light emitted by the phototransmitter 76 is occluded selectively by the marks 64 and the beam of light emitted by the phototransmitter 78 is occluded selectively by the mark 68. As the marks 64 are moved by the phototransmitter 76, a pulse train of timing pulses is generated. Each timing pulse generated at the photoreceptor 78 is communicated to the CPU 80 for generating encoded information regarding the angular position of drum 10.

Commonly, the reference mark 68 is used to designate a position along the disk 62. In the illustrated embodiment of FIG. 4, the phototransmitter 78 and photoreceiver 79 are positioned so that a pulse is generated each time the disk 62 makes a revolution. Each time the reference mark passes by the sensing system 74, a suitable signal is transmitted from the photoreceiver 79 to the CPU 80, and a reference pulse is accordingly generated. In response to the generated reference pulse, an index pulse of desired duration can be generated by use of known circuitry.

It is recognized that the dual channel encoding arrangement 70 discussed above is well suited for its intended purpose. That is, when the timing pulses generated with the sensing system 72 are considered in conjunction with the index pulse generated with sensing system 74, both precise and accurate information regarding the angular position of drum 10 can be determined. The dual encoding arrangement 70, however, is less than cost effective in at least two respects. First, an excessive amount of sensing circuitry is required to implement arrangement 70 since two separate sensing systems, rather than one sensing system, must be employed. Using two sensing systems 72, 74, rather than one sensing system, tends to decrease the reliability of the encoding arrangement 70. Second, the "art work" required to implement disk 62 is made relatively difficult by the need to draw the reference mark 68 separate from the marks 64 and align the mark 68 with the marks 64.

Figure 5A:
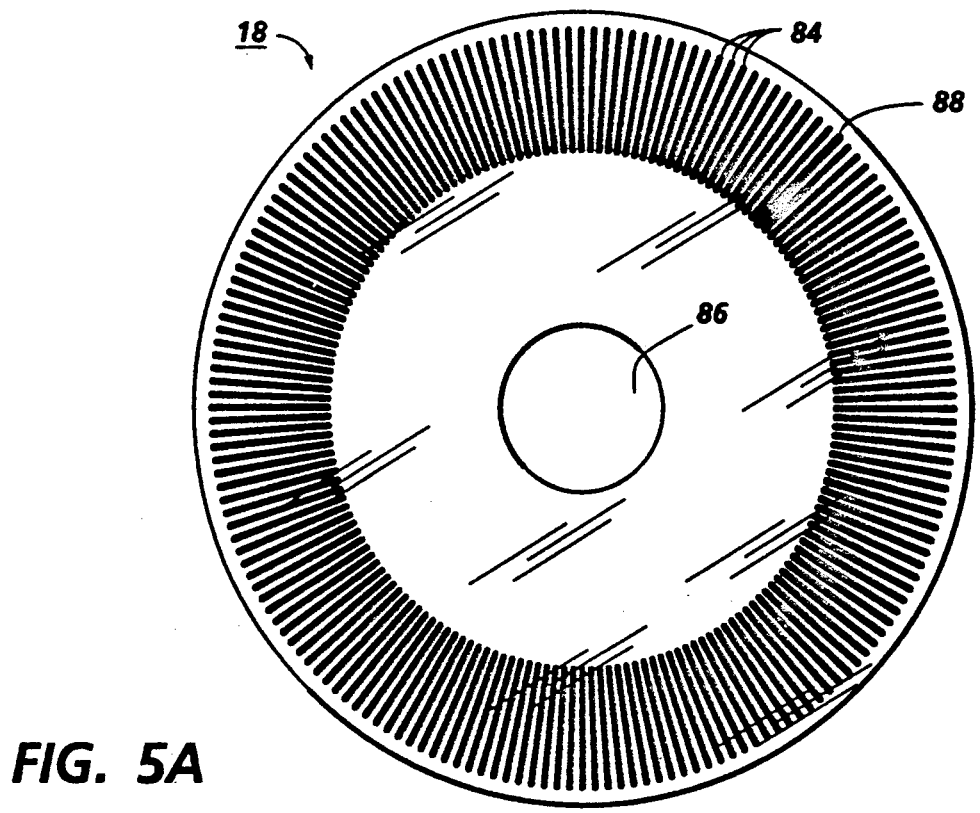
FIG. 5A is an elevational view of the disk of FIGS. 1 and 2A.

Referring to FIG. 5A, the significance of the improved disk 18 is discussed in further detail. The disk 18 comprises a plurality of marks 84, the marks 84 being disposed along a common track concentrically about a center 86 of the disk 18. One of the marks 84, which is slightly wider than the other marks 84, is designated by the numeral 88. Preferably, the spacing between any immediately adjacent marks 84 is about the same throughout the disk 18. It will be recognized from the discussion below, that the mark 88 is a reference mark configured to permit the disk 18 to achieve the same functions as the dual channel encoding arrangement 70 described above. As with disk 62, the disk 18 is constructed from a durable, translucent material, such as a conventional plastic or the like.

Figure 5B:
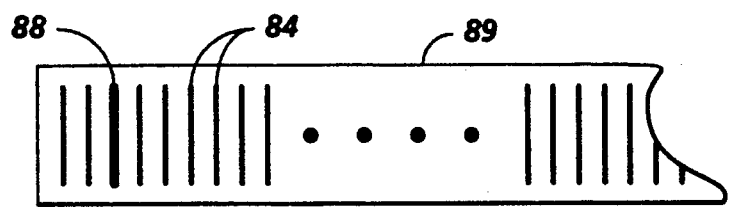
FIG. 5B is an elevational view of a strip having spaced marks disposed thereon, the strip being adapted for use in the single channel encoder of the present invention.

While the marks 84 and 88 are shown disposed on a disk, the concept of the invention would not be altered by using mediums other than a disk. For example, as shown in FIG. 5B, the marks 84, 88 could be disposed on an elongate strip 89. In another example (FIG. 7), the marks 84, 88 could be disposed along a peripheral portion of the drum 10. As will be appreciated by those skilled in the art, even though marks 84, 88 are shown as stripes painted on a surface, it is contemplated that the marks 84, 88 could also be slits or holes in the disk 18, the drum 10 (FIG. 7) or the strip 89.

Figure 6:
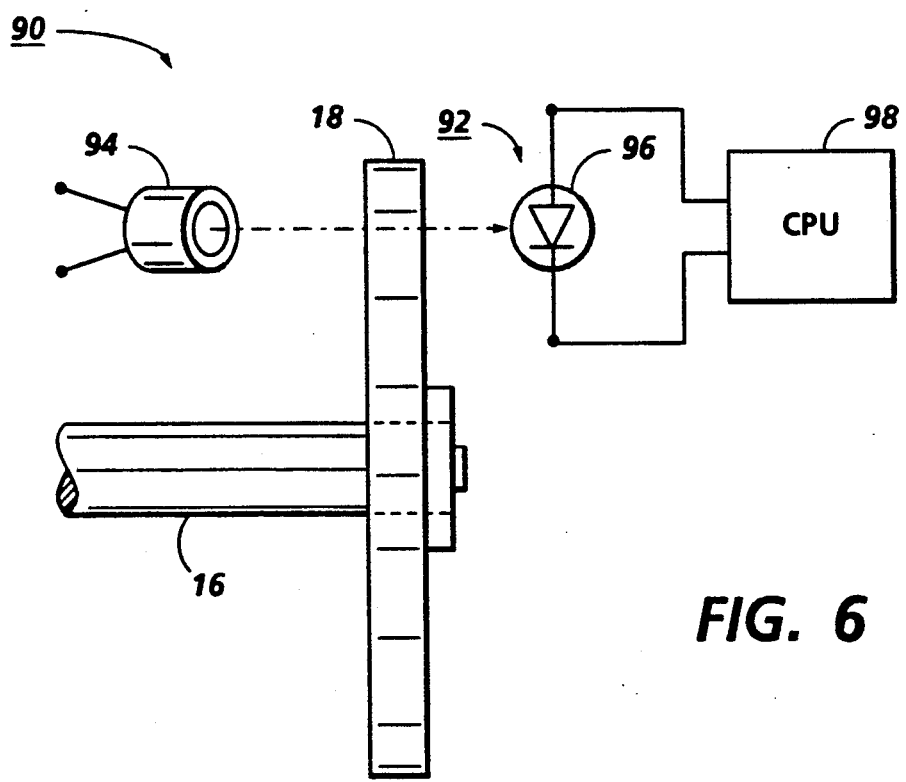
FIG. 6 is a schematic, elevational view of the disclosed embodiment of the single channel encoder employing the disk of FIG. 5A.

Referring to FIG. 6, a single channel encoder, employed in one preferred embodiment of the present invention, is designated by the numeral 90. The single channel encoder 90 comprises a sensing system 92, the sensing system 92 including a phototransmitter 94 and a photoreceiver 96. The sensing system 90 is positioned relative to the disk 18 so that an encoder pulse train 100 (FIG. 8) is generated as the marks 84, 88 are passed by the sensing system 92. The encoder pulses are transmitted from the phototransmitter 94 to a CPU 98, the CPU 98 being equivalent in structure to the CPU 80. The CPU 98 includes components, such as a clock as well as various counters and registers, necessary to implement the preferred embodiment of the invention. While the single channel encoder 90 is shown in use with the disk 18, it will be understood that the sensing system 92 could be used interchangeably with the strip 89 without altering the concept underlying the present invention.

Figure 8:
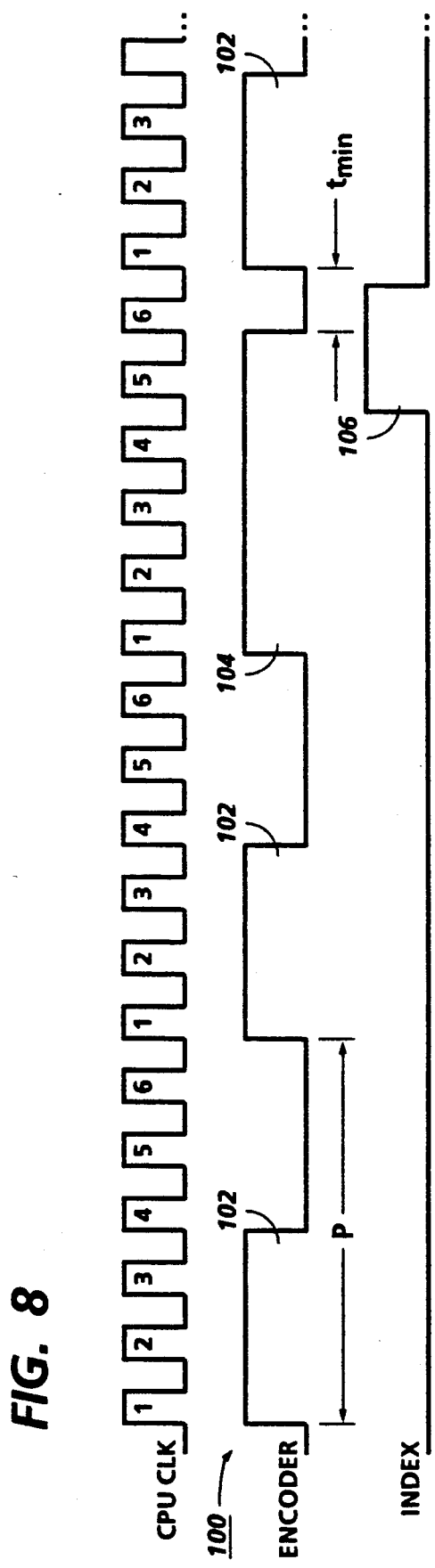
FIG. 8 is a timing diagram illustrating the manner in which an index pulse can be generated with the single channel encoder of the present invention.

Referring particularly to FIG. 8, the encoder pulse train 100, which includes timing pulses 102 and a reference pulse 104, is discussed in further detail. It will be appreciated by those skilled in the art that the sensing system 92 could be a reflectance based system rather than the transmissive based system of FIG. 6. That is, the phototransmitter 94 and the photoreceiver 96 could be positioned above the marks 84, 88, on a common side of the drum 10, the disk 18 or the strip 89 so that upon emitting a beam from the phototransmitter 94, reflected light is transmitted to the photoreceiver 96 for generating the encoder pulse train 100.

The period of the encoder pulse train 100, namely "p," is defined by a duration between two leading edges of any two immediately adjacent pulses. In the illustrated embodiment of FIG. 8, the clock of the CPU 98 is employed to determine the duration p of the pulse train 100. While in the example of FIG. 8, the duration of p is three pulses, it will be recognized that the number of pulses occurring for p will vary according to the speed of the clock. Indeed, for a relatively fast clock, many pulses would occur for each duration p. Preferably, the marks 84 are equal in width so that each of the timing pulses 102 remains high for about the same duration. On the other hand, since the reference mark 88 is slightly wider than the marks 84, the reference pulse 104 remains higher for a substantially longer duration than any of the timing pulses 102. Even though the reference pulse 104 is higher for a longer duration than any of the timing pulses 100, the duration of the reference pulse 104 does not exceed the duration p, and p remains constant throughout the encoder pulse train 100. Since the encoder 90 operates, in part, on the basis that the occurrence of a single pulse in a period corresponds to the occurrence of a timing pulse 102, the reference pulse 104 can serve as a timing pulse.

Additionally, since the reference pulse 104 has a width that is relatively greater than any of the timing pulses 102, the reference pulse 104 can be employed to generate an index pulse 106. In the preferred embodiment the index pulse 106 can be used to indicate when either the disk 18 (FIG. 5A) or the drum 10 (FIG. 7) has reached a designated position, or when the strip 89 (FIG. 5B) has been moved a given distance relative to the sensing system 92. In operation, the index pulse 106 goes high after the reference pulse 104 has been high for a preselected duration. For example, referring to the illustrated embodiment of FIG. 8, the index pulse 106 is triggered when a trailing edge of a clock pulse, designated by the numeral "4," coincides with the reference pulse 104. As will be appreciated by those skilled in the art, the duration of the index pulse could be extended by a known arrangement comprising a multivibrator and one or more counters. It will also be appreciated by those skilled in the art that while the pulse train 100 is shown as synchronized with the clock of CPU 98, the clock and pulse train 100 need not be synchronized to implement the present invention. It will be understood from the discussion above that while the index pulse 106 is generated with the CPU 98, the index pulse 106 could be generated with one of many digitally-based circuits including one or more of the following components: multivibrators, flip-flops or other gating arrangements, counters, Schmitt triggers and a variety of other known logical devices.

Figure 9:
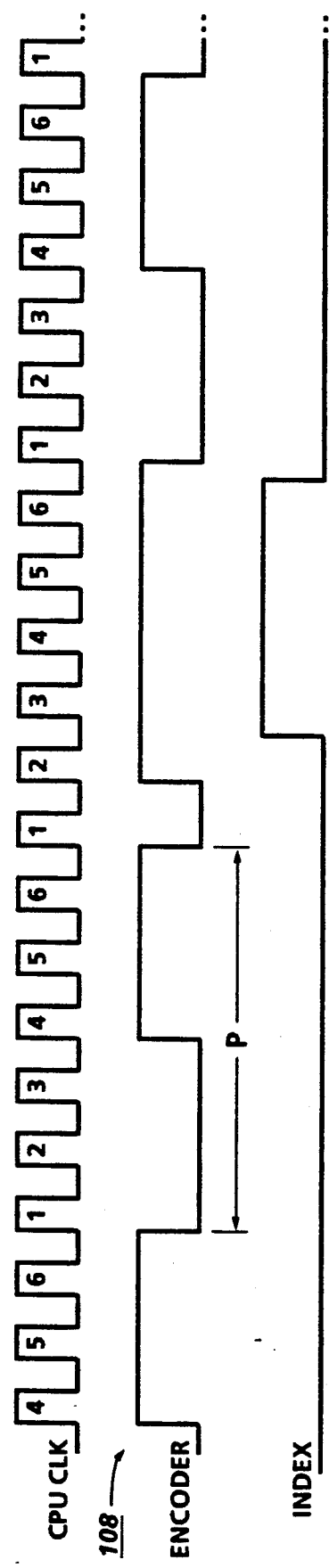
FIG. 9 is another timing diagram illustrating the manner in which an index pulse can be generated with of the single channel encoder of the present invention.

Referring to FIG. 9, a data processing approach similar to that of FIG. 8 is shown. As noted above, the approach of FIG. 8 uses the leading edges of any two adjacent pulses to determine the period of the encoder pulse train 100. In contrast, the approach of FIG. 9 uses the trailing edges of two adjacent encoder pulses 98 to define the period of an encoder pulse train 108. As with the encoder pulse train 100, the period for the encoder pulse train 108 is constant throughout. Moreover, in the illustrated embodiment of FIG. 9, the index pulse is triggered when a reference pulse coincides with the trailing edge of a clock pulse designated by the numeral "2."

Referring to FIGS. 5A, and 6-9, it can be recognized that the results of the pulse trains generated from the marks on drum 10, the disk 18 and the strip 89 can be employed to determine the respective directions of movement of the drum 10, the disk 18 and the strip 89. For example, considering the pulse train 100, the duration between the trailing edge of the reference pulse 104 and the leading edge of the last shown timing pulse 102, designated as $t_{MIN}$ (FIG. 8), is less than the duration between any other two immediately adjacent pulse edges in the pulse train 100. Accordingly, when movement is one direction, the relatively long duration of the reference pulse 104 is followed by $t_{MIN}$, and in another, opposite direction, $t_{MIN}$ is followed by the relatively long duration of the reference pulse 104.

What is claimed is:

1. An apparatus for generating a pulse train having a plurality of timing pulses, comprising:
   a member having a plurality of spaced marks disposed thereon with one of the spaced marks being a reference mark having a leading edge and a trailing edge; and
   means, in communication with said member, for generating the pulse train as the plurality of spaced marks move, the pulse train being defined by a series of durations, each of the durations having a periodicity defined by the same edge of two successive pulses, the plurality of spaced marks being configured so that the periodicity of each duration remains constant throughout the pulse train and said generating means forms a reference pulse from the reference mark as the leading and trailing edges of the reference mark are moved adjacent the generating means, the reference pulse occurring during one of the durations and serving as one of the timing pulses.

2. The apparatus of claim 1, wherein:
   said member comprises a disk, said disk having a track that is concentric about the center of said disk; and
   the spaced marks are disposed along the track, each of the spaced marks being substantially transvers to the track.

3. The apparatus of claim 2, further comprising means for coupling said disk with a shaft so that said disk is capable of moving in unison with said shaft.

4. The apparatus of claim 3, wherein the coupling means comprises:
   a second shaft, said disk being mounted to said second shaft;
   a modular unit for housing said disk, at least a portion of said second shaft being rotatably mounted to said housing; and
   means for coupling said first shaft with said second shaft.

5. The apparatus of claim 1, wherein:
   said member comprises an elongate strip, said elongate strip having a central axis; and
   the spaced marks are disposed along the central axis, each of said spaced marks being substantially transverse to the central axis.

6. The apparatus of claim 1, wherein said generating means comprises means for transmitting a beam of light and means for receiving the beam, said member being disposed intermediate of said transmitting means and said receiving means so that as said member moves, light is selectively occluded by the plurality of spaced marks.

7. In a printing apparatus of the type having a moving photoconductive member, an apparatus for generating a pulse train defined by a plurality of timing pulses occurring respectively in a series of durations, comprising:
   a disk having a plurality of spaced marks disposed thereon with one of the spaced marks being a reference mark having a leading edge and a trailing edge, wherein the plurality of spaced marks are substantially colinear and configured so that the periodicity of the durations are substantially equal;
   means for coupling said disk with the photoconductive member so that said disk moves in unison with the photoconductive member; and
   means, in communication with said disk, for generating the pulse train as the plurality of spaced marks move, a reference pulse being generated each time the leading and trailing edges of the reference mark are detected by said generating means, the reference pulse occurring during one of the durations and serving as one of the timing pulses.

8. The pulse train generating apparatus of claim 7, wherein said generating means comprises means for transmitting a beam and means for receiving the beam, said disk being disposed intermediate of said transmitting means and said receiving means so that as said member moves, light is selectively occluded by the plurality of spaced marks.

9. An apparatus for generating a pulse train defined by a plurality of timing pulses occurring respectively in a series of durations, comprising:
   a photoconductive member having a plurality of spaced marks disposed thereon with one of the spaced marks being a reference mark with a leading edge and a trailing edge, wherein the plurality of spaced marks are substantially colinear and configured so that the periodicity of the durations are substantially equal; and
   means, in communication with said photoconductive member, for generating the pulse train as the plurality of spaced marks move, a reference pulse being generated each time the leading and trailing edges of the reference mark are detected by said generating means, the reference pulse occurring during one of the durations and serving as one of the timing pulses.

10. The apparatus of claim 9, wherein said generating means comprises means for transmitting a beam and means for receiving the beam, said disk being disposed intermediate of said transmitting means and said receiving means so that as said member moves, light is selectively occluded by the plurality of spaced marks.

11. A method for generating a pulse train defined by a plurality of timing pulses occurring respectively in a series of durations, said method being adapted for use with a member having a plurality of spaced marks disposed thereon with one of the spaced marks being a reference mark with a leading edge and a trailing edge, said method comprising the steps of:

generating the pulse train by moving the plurality of spaced marks adjacent means for generating the pulse train, the pulse train being defined by a series of durations, each of the durations having a periodicity defined by the same edge of two successive pulses;

configuring the plurality of the spaced marks so that the periodicity of the pulse train remains constant; and generating a reference pulse as the leading and trailing edges of the reference mark are moved adjacent the generating means, the reference pulse occurring during one of the durations and serving as one of the timing pulses.

12. The method of claim 11, in which the member is a disk, further comprising the step of configuring the spaced marks so that the reference pulse characterizes both the beginning and end of a revolution of the disk.

* * * * *